SEMICONDUCTOR DEVICE AND METHOD OF MANUFACTURE

Filed Oct. 5, 1966

INVENTORS
JAN BOEREMA
MEINDERT J. TEGEL
BY
AGENT

United States Patent Office 3,469,156

Patented Sept. 23, 1969

3,469,156

SEMICONDUCTOR DEVICE AND METHOD OF MANUFACTURE

Jan Boerema and Meindert Johan Tegel, Stadskanaal, Netherlands, assignors, by mesne assignments, to U.S. Philips Corporation, New York, N.Y., a corporation of Delaware Filed Oct. 5, 1966, Ser. No. 584,421
Claims priority, application Netherlands, Oct. 7, 1965, 6512980
Int. Cl. H01l 5/04, 7/60, 9/08
U.S. Cl. 317—236 4 Claims

ABSTRACT OF THE DISCLOSURE

Contact to a semiconductor diode within a glass envelope is made by a conductor extending into the envelope and there joined to a wire-shaped electrode; the conductor and electrode are coated with a glass enamel to improve the stability of the device.

The invention relates to a method of manufacturing a semiconductor device, more particularly a crystal diode or a transistor, which has a sealed envelope through the wall of which is passed at least one conductor of which the part extending inside the envelope reaches a high temperature during the sealing process. A high temperature is to be understood to mean herein a temperature of the order of the sealing temperature, for example, in case of a glass envelope, of the order of the softening temperature of the glass used.

It has been found that, after sealing, such devices may exhibit instabilities. Investigations have shown that these instabilities could be due to the formation of oxidation products on the part of the said conductor extending inside the envelope, which products could scale off, for example, and could spoil the electrical properties of the device. As another potential cause was found that due to the said oxidation the oxygen content inside the envelope was reduced, whereas free oxygen just could have a stabilizing effect.

Irrespective of the correctness of these explanations, the invention has inter alia for its object to improve the stability of such semiconductor devices.

According to the invention, the part of the said conductor extending inside the envelope is coated with an enamel layer. This is preferably effected in that prior to sealing the said part is provided with a layer of glass suspension which during sealing converts into an enamel layer. The invention is particularly suitable for use in the manufacture of semiconductor bodies having a conductor which is sealed into the envelope and which supports a wire-shaped electrode connected with the semiconductor body. The term "connected" is to be understood herein to mean both a solely electrical connection and an electrical and at the same time mechanical connection.

The invention further relates to a semiconductor body obtained by the use of one of the methods described above and more particularly to a crystal diode having a sealed envelope through the wall of which a conductor is passed of which the part extending inside the envelope supports a wire-shaped electrode which is connected with a semiconductor body, which device is characterized in that this part is coated with an enamel layer.

The invention will now be described more fully with reference to an embodiment shown in the figures, of which:

Figure 1:
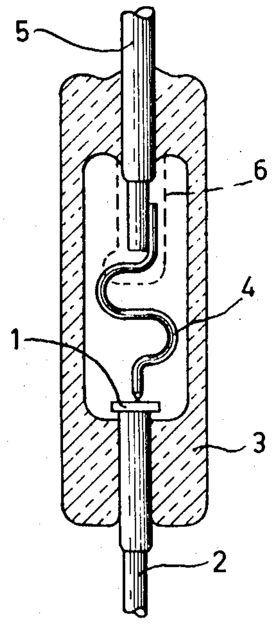
FIG. 1 shows on an enlarged scale in sectional view a crystal diode.

FIG. 1 shows a crystal diode having a semiconductor body 1, for example, a germanium single crystal of the n-conductivity type which is secured to a support 2. The support is sealed into a glass tube 3. A point contact 4 which is secured to the end of a conductor 5 likewise sealed into the wall of the envelope presses on the body 1. Instead of a point contact, it is possible to use a wire-shaped electrode locally fused to the semiconductor body. This electrode may consist, for example, of gold, which is the case more particularly in so-called "gold-bonded" diodes.

It will appear hereinafter that during sealing of the envelope, the lower end of the conductor 5 may reach a comparatively high temperature, for example, of approximately 600° C. This conductor consists, for example, of a nickel-iron core and a copper sheath, the expansion coefficient of the conductor being adapted to that of the glass and the sheath and the said glass being satisfactorily fused together.

In order to improve the stability of the diode, an enamel layer indicated with a dotted line 6 is applied which surrounds the lower end of the conductor 5 and the adjoining part of the point contact 4.

For this purpose, the conductor 5, before being sealed into the envelope, is coated at its lower end with a layer consisting of a glass suspension.

Figure 2:
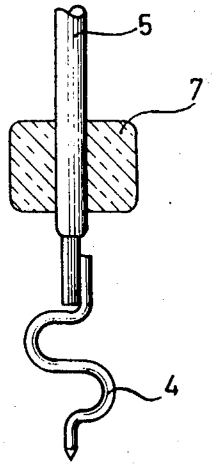
FIGS. 2 to 4 show partly in elevational view and partly in sectional view a conductor supporting a wire-shaped electrode.
Figure 3:
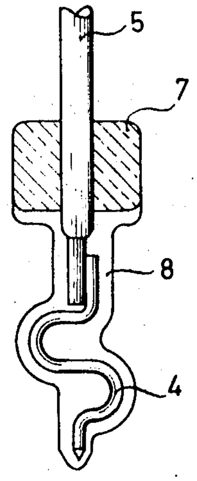

FIG. 2 shows the conductor 5 provided with a sealed glass-bead 7 and with a point contact 4. This assembly is immersed in the glass suspension, a layer 8 of this suspension remaining on the lower part of the conductor 5 and on the point contact 4 (cf. FIG. 3). Subsequently, the suspension is washed away from the lower part of the point contact 4 by immersing it in alcohol (cf. FIG. 4). It should be noted that the composition of the glass suspension is not essential to the invention. In general, the suspensions commonly used for forming enamel layers can be used also in this case.

The glass suspension layer 8 may then be converted by heating into enamel, whereupon the conductor may be sealed into an envelope by means of the glass bead 7.

However, the method is effected in a very simple manner if the suspension layer 8 is caused to be converted into enamel during the sealing process.

Figure 5:
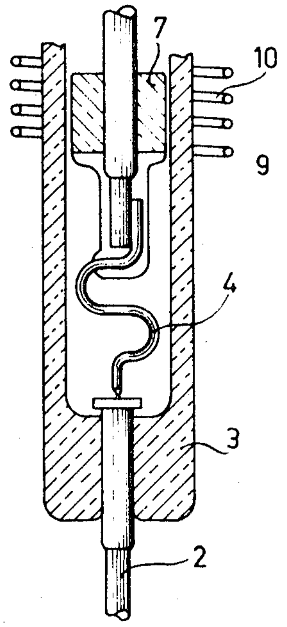
FIG. 5 is a sectional view of a diode before the envelope is sealed.
Figure 4:
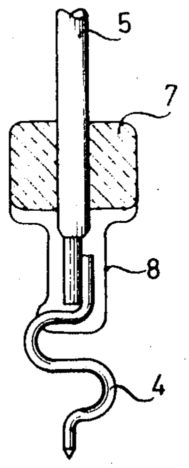

For this purpose, the assembly shown in FIG. 4 is slipped into the tubular part 9 of the envelope in which the semiconductor body 1 and the support 2 have already been provided (cf. FIG. 5).

The electrical forming treatment usual in the manufacture of point contact diodes followed by an electrical checking measurement can be carried out already at this manufacturing stage, which has the advantage that the part of the diode not satisfying the requirements can be used again. In "gold-bonded" diodes the gold wire can be fused to the semiconductor body also at this stage.

Subsequently, the upper part of the envelope is heated above the softening temperature of the glass, for example, with the aid of a heater element 10. Thus, the bead 7 is sealed into the upper end of the tube 9 while at the same time the suspension layer 8 is converted into the enamel layer 6, shown in FIG. 1 in dotted lines.

It is apparent from the foregoing that a protective layer may thus be applied to the inner part of the conductor without involving a drastic or time-consuming modification of the manufacturing process. It would also have been possible to coat the said part with a protective layer consisting, for example, of silver by electrode position.

However, the application of such a layer would involve a drastic modification of the manufacturing process.

What is claimed is:

1. A semiconductor device comprising a sealed envelope having glass end wall portions, a semiconductor body within the envelope, first connection means to the semiconductor at one end wall portion, second connection means to the semiconductor, said second connection means comprising a first metal conductor of a composition adapted for sealing to the glass of the other end wall, said metal conductor extending through and being heat sealed into the other end wall in such manner that a part extends within the envelope spaced from the envelope side walls and another part is external to the envelope, a metal wire-shaped electrode spaced from the envelope walls and connected at one end to the conductor part within the envelope and at its opposite end to the semiconductor, and a coating of a fused glass enamel spaced from the envelope side walls surrounding and adherent to the part of the conductor extending within the envelope and the adjacent connected part of the wire electrode but terminating short of the wire end connected to the semiconductor.

2. A device as set forth in claim 1 wherein the wire-shaped electrode has a pointed end where it connects to the semiconductor.

3. A method of making a semiconductor device comprising providing a glass envelope having at one end a semiconductor and open at the opposite end, providing a conductor having connected at one end a wire-shaped electrode, providing a glass bead on the conductor, thereafter coating the wire-shaped electrode and adjacent conductor portion up to the bead with a layer of glass leaving the wire end exposed, fusing the glass layer to form an enamel, and heat sealing the glass bead on the conductor to the open end of the envelope with the wire end connected to the semiconductor inside the envelope and with the conductor, wire-shaped electrode, and enamel spaced from the envelope side walls.

4. A method as set forth in claim 3 wherein the glass layer is applied as a glass suspension and is fused into an enamel at the same time that the bead is heat sealed to the envelope.

References Cited

UNITED STATES PATENTS 2,694,168 11/1954 North et al. ---------- 317—234

FOREIGN PATENTS 691,708 5/1953 Great Britain.

JOHN W. HUCKERT, Primary Examiner

J. R. SHEWMAKER, Assistant Examiner

U.S. Cl. X.R.

29—587